United States Patent [19]

Gawler

[11] 4,378,531

[45] Mar. 29, 1983

[54] NEGATIVE RESISTANCE OSCILLATOR SUITED FOR PARTIAL INTEGRATION

[75] Inventor: Glenn B. Gawler, Liverpool, N.Y.

[73] Assignee: General Electric Company, Syracuse, N.Y.

[21] Appl. No.: 242,368

[22] Filed: Mar. 10, 1981

[51] Int. Cl.[3] .................... H03B 7/06

[52] U.S. Cl. .................... 331/115; 331/117 R

[58] Field of Search .......... 331/117 R, 108 C, 108 D, 331/115, 132, 133, 134, 151, 167, 150

[56] References Cited

U.S. PATENT DOCUMENTS 3,986,152 10/1976 Howell .................... 331/115 X 4,230,999 10/1980 Ahmed .................... 331/115

OTHER PUBLICATIONS

Greben, A. B., "Monolithic Waveform Generation", *IEEE Spectrum*, pp. 34–40, Apr. 1972, (reprinted in Analog Integrated Circuit Design, pp. 378–384, A. B. Grebene, 1972).

*Primary Examiner*—Siegfried H. Grimm

*Assistant Examiner*—Tim A. Wiens

*Attorney, Agent, or Firm*—Richard V. Lang

[57] ABSTRACT

A novel negative resistance oscillator is disclosed for partial integration. The oscillator has a tank circuit and a load, which are non-integrated, and active circuitry, which is integrated. The active circuit consists of a current "source" and two current "sinks", arranged to provide a negative resistance. The oscillator, which is designed to drive an erase head in a tape recorder, as a part of a tape recorder integrated circuit, requires only a single additional pin, has a controlled peak current range, a large dc voltage swing for a given dc supply potential, and an efficient dc to ac current conversion ratio.

9 Claims, 1 Drawing Figure

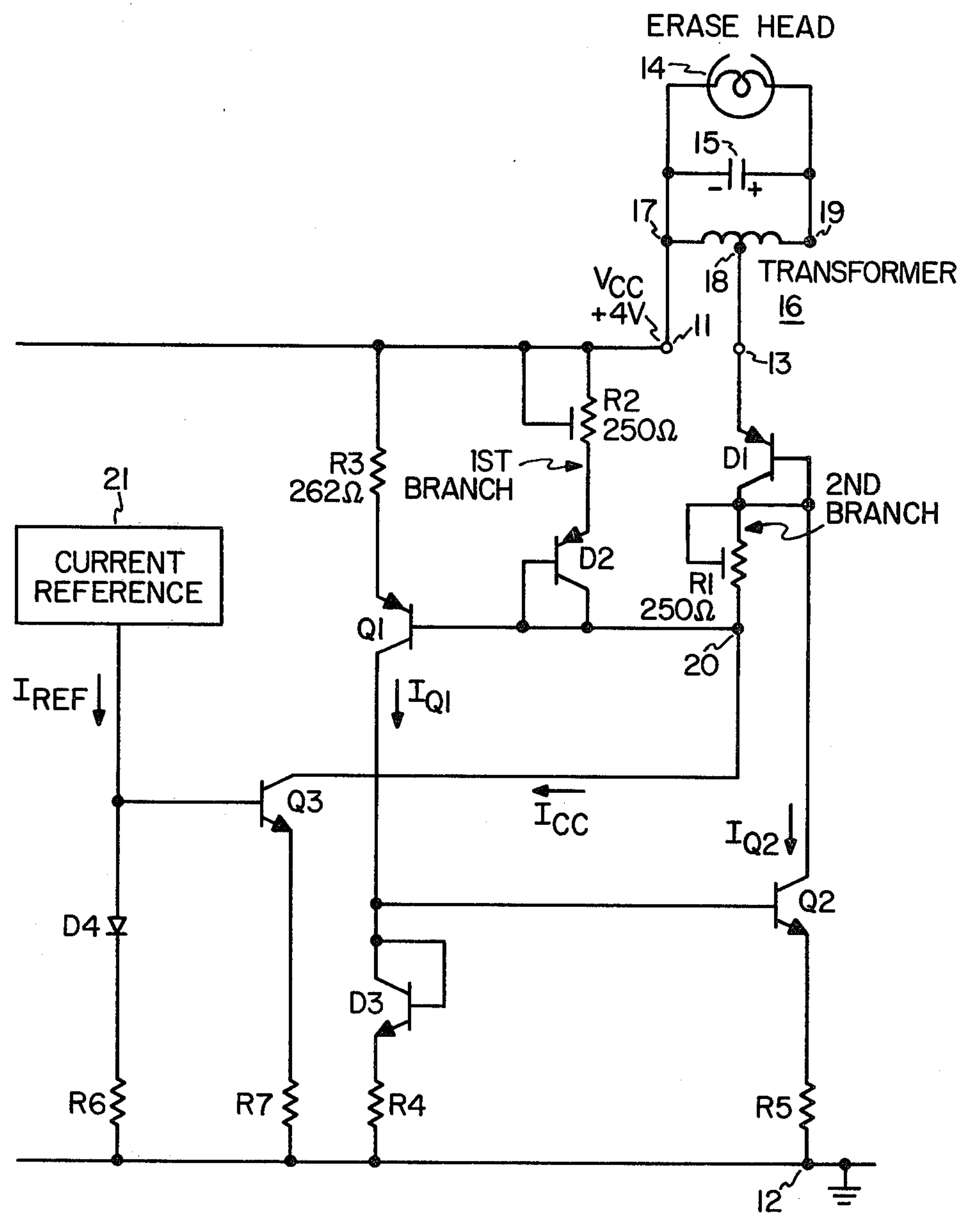
ERASE HEAD
14
15
17
19
18
TRANSFORMER
16
VCC
+4V
11
13
R2
250Ω
D1
1ST
BRANCH
R3
262Ω
2ND
BRANCH
21
CURRENT
REFERENCE
D2
R1
250Ω
Q1
20
IREF
IQ1
Q3
ICC
IQ2
Q2
D4
D3
R6
R7
R4
R5
12

NEGATIVE RESISTANCE OSCILLATOR SUITED FOR PARTIAL INTEGRATION

BACKGROUND OF THE INVENTION

1. Field of the Invention

The present invention relates to oscillators and more particularly to negative resistance oscillators produced by connecting a parallel tuned resonant circuit to a two terminal negative resistance circuit. A negative resistance circuit is one in which an increase in voltage results in a decrease in current. More particularly, the negative resistance oscillator herein described employs a plurality of transistors connected to exhibit the foregoing negative resistance characteristics and is fabricated of components suitable for integration into a monolithic substrate.

2. Description of the Prior Art

Negative resistance oscillators are known per se and the individual circuits which comprise the oscillator include current sources and current sinks which are known per se. Such circuits are, for instance, described in a book entitled "Analogue Integrated Circuit Design" by Aaron B. Grebene, published in 1972 by Von Nostrand Reinholdt Company.

In integrated circuit application, a negative resistance oscillator must ordinarily satisfy a complex set of constraints consistent with the overall integration technique. More particularly, assuming that a particular circuit function is to be added to other IC circuitry performing other circuit functions, it is desirable that the incremental pin count of the additional function be at a minimum. It is also desirable that the partitioning be consistent with the costs of integrating components, which permits the addition of resistances (in a certain range) or active devices at small incremental costs, while generally prohibiting the integration of inductors or capacitors. Thus, the partitioning must preferably take place at a circuit boundary where only nonintegratable components are off the chip and only integratable components are on the chip, and as noted earlier, the interconnections between on and off the chip portions are at a minimum.

The electrical properties of the oscillator are dictated by the application. The present application is to the erase head of a tape recorder. In this application, it is desirable that the voltage swing of the oscillator be optimum, consistent with a limited dc bias, often present in low cost IC designs. There should be a control of the peak current swing, an adequate current drive capability, and efficient dc to ac current conversion.

SUMMARY OF THE INVENTION

Accordingly, it is an object of the present invention to provide an improved oscillator suited for integrated fabrication.

It is still another object of the present invention to provide an improved negative resistance oscillator.

These and other objects of the invention are achieved in a negative resistance oscillator having three terminals at the interface between the integrated portion of the oscillator and the nonintegrated portion. The three terminals are, respectively, for connection to a positive dc potential, for connection to ground, and for connection to a resonant tank circuit. The resonant tank circuit may take the form of a transformer having the primary connected between the first and third terminal. The secondary of the transformer provides a means for coupling a load to the tank circuit.

The integrated portion of the oscillator includes a current source comprising a first transistor gain element having its emitter connected to positive dc potential through a biasing resistance. The base of the first transistor is connected to the node of a three branch circuit. The first branch includes a serially connected first diode and a first resistance connected to conduct current to the node from the positive terminal. The second branch includes a serially connected second diode and a second resistance connected to conduct current to the node from the third (tank circuit connected) terminal. The third branch is a first current sink connected to withdraw a controlled current $I_{CC}$ from the node to ground. In the arrangement, any decrease in current in the first branch causes a decrease in current in the second branch and vice versa.

The collector of the first transistor is connected through a load including a serially connected third diode and a fourth resistance to ground.

The current in the current source has a first proportionality (M1) to the control current ($I_{CC}$) when the diode in the second branch is nonconductive. This proportionality may be unity.

A second current sink is provided comprising a second transistor gain element having its emitter connected through a fifth resistance to ground, and the base connected across the load of the current source. The current of the second sink has a second proportionality (M2) to the source current (M1) ($I_{CC}$) when the diode in the second branch is nonconductive.

The oscillator so far described operates between a first state in which the first branch of the three branch network is conductive (the second branch is nonconductive) and the oscillator output current is equal to the controlled current ($I_{CC}$) times the first (M1) and second (M2) proportionality:

$$(I_{CC})\ (M1)\ M2;$$

and a second state in which the second branch is conductive (the first branch is nonconductive) and the oscillator output current is equal to the controlled current ($I_{CC}$). In short, the oscillator operates between two stabilized operating conditions in which both the peak and minimum currents are controlled.

BRIEF DESCRIPTION OF THE DRAWING

The novel and distinctive features of the invention are set forth in the claims appended to the present application. The invention itself, however, together with further subjects and advantages thereof may best be understood by reference to the following description and accompanying drawing which is an electrical circuit diagram of a negative resistance oscillator suitable for partial integration into the more complex integrated circuit and having application to driving the erase head of a tape recorder.

DESCRIPTION OF THE PREFERRED EMBODIMENT

A negative resistance oscillator designed to drive the erase head of a tape recorder and suitable for partial integration is illustrated in the drawing. The integrated circuit portion of the oscillator has a first terminal for connection to a positive dc bias potential, a second terminal 12, which is typically the substrate of the integrated circuit, for connection to a dc reference potential or ground, and a third terminal for connection from the chip to a resonant tank circuit (15, 16) in which the oscillator output is developed and to which the erase head 14 is connected. More particularly, the resonant tank circuit includes a capacitor 15, and a step-up autotransformer 16 having a common terminal 17 connected to the terminal 11 of the integrated circuit, a primary tap 18 connected to the terminal 13 of the integrated circuit and a secondary terminal 19. The capacitor 15 and erase head 14 are connected between the common autotransformer terminal 17 and the secondary terminal 19.

The oscillator depicted in the drawing provides a 6 volts peak to peak swing for a 4.0 volt bias and 25 milliamperes rms erase head current for 11 milliamperes of dc input current. The output current is controlled to a typical peak value of 17 milliamperes and a controlled minimum current of approximately 1.7 milliamperes. The dc to ac conversion rate is 1.2 ma (fundamental peak) for 1 ma dc and oscillation is assured over a significant reduction in voltage from optimum.

The integrated circuit portion of the negative resistance oscillator comprises three transistors (Q1, Q2 and Q3) and sundry diodes and resistances associated with these transistors to form respectively a current source, and a first and a second current sink connected in a gain producing configuration.

The current source (associated with the transistor (Q1) includes the components Q1, R3, R2, D2, D1, R1, and supplies a controlled current to a load consisting of the elements D3, D4. More particularly, the emitter of the transistor Q1 is connected through biasing resistance R3 to the terminal 11 to which positive bias potentials ($V_{CC}$) are supplied. The collector of the transistor Q1 is serially connected through the diode D3 and resistance R4 to the substrate terminal 12. The base of the transistor Q1 is connected to the node 20 of a three branch biasing network in which the first branch includes a resistance R2 and diode D2 connected in series to $V_{CC}$ terminal 11, the second branch includes the diode D1 and resistance R1 connected in series to terminal 13 and the node is returned to ground through a current sink associated with transistor Q3 and providing a controlled current from the node.

Continuing, the current source transistor Q1 is a lateral PNP transistor having a beta lying in the range of from 20–60 and an area of four times minimum geometry. The emitter resistance is 262 ohms having a value which is calculated to produce an output current substantially equal to that supplied to the first branch D2, R2. In the first branch, the resistance R2 has a value of 250 ohms and the diode D2 is a diode connected lateral PNP transistor of minimum geometry with base and collector joined. The second branch of the biasing network, includes a second diode connected lateral PNP transistor D2 of minimum geometry connected to resistance R1 of 250 ohms. Assuming a condition in which terminal 13 is of the same potential as the $V_{CC}$ potential, and neglecting the base current of transistor Q1, the currents in the first and second branches would be equal and half of the current provided by the first current sink Q3. As the discussion will eventually show, oscillation of the negative resistance oscillator occurs with the first and second branches alternately conducting at a current equal to that set by the current sink, which will now be discussed.

The first current sink (associated with the transistor Q3) includes the components Q3, R7, D4, R6 and a current reference illustrated by the block 21, which may in practice use a band gap regulator. Alternatively, a band gap regulator may be used to set the base voltage of Q3. The current sink transistor Q3 is an NPN transistor having a beta lying in the range of from 80 to 250 and having a minimum geometry area. A biasing resistance R7 is connected between the emitter of Q3 and substrate terminal 12. The reference current source 21 is connected to the base of transistor Q3 and to the anode of diode D4. The cathode of diode D4 is connected through resistance R6 to the substrate terminal 12. With a diode D4 of minimum geometry, resistances of 200 ohms for R6 and 48 ohms for R7, and a current reference ($I_{Ref}$) of 0.57 milliamperes, the current sink has a current proportionality (M3) of 3.05, and produces a first sink output current ($I_{CC}$) of 1.70 milliamperes, which it draws from the node 20. Assuming that the second branch is nonconducting, then the source output current (IQ1) equals (M1) ($I_{CC}$). If M1 is taken to be "1", then the source output current (IQ1) equals the first sink output current $I_{CC}$. The current IQ1 supplied from the source to the load D3, D4, is used to bias the second current sink.

The second current sink (associated with the transistor Q2) includes components Q2, R5, D3 and R4. The current sink transistor Q2 is an NPN transistor having a beta lying in the range of from 80–250 and having an area four times minimum geometry. A biasing resistance R5 is connected between the emitter of Q2 and the substrate terminal 12. The base of transistor Q2 is connected to the connection of the collector of current source Q1 to the anode of diode D3. The emitter connected resistance R5 has a value of 12 ohms while the value of resistance R4 is 140 ohms. The configuration is designed to produce a second proportionality (M2) equal to "10" between the output current (IQ2) and the input current (IQ1) of the second current sink.

Continuing now with the assumption that the second branch (diode D1) of the three branch circuit is nonconducting and the first branch conducting, the source current (IQ1) equals (M1) ($I_{CC}$), and the second sink current (IQ2) equals (M1) (M2) ($I_{CC}$) leading to an output current of 17 milliamperes.

The oscillator so far described will oscillate between two limits. In the upper limit, the diode (D2) in the first branch of the three branch network conducts essentially all of the output current ($I_{CC}$) available through the first current sink and the diode (D1) in the second branch is nonconducting. At this upper limit, the transistors Q1 and Q2 become fully conductive and the second sink current (IQ2) establishes the maximum load current (17 ma) drawn from the load circuit through the terminal 13. In the lower limit, the diode D1 in the second branch conducts all of the current available through the first current sink ($I_{CC}$) and none is drawn by the diode D2 in the first branch. Consequently, transistors Q1 and Q2 are nonconductive. In this state, the current drawn through the load is the unamplified 1.70 ma available through the first current sink.

The onset of oscillations may be described in the following manner. When power is first applied to the network, current commences to flow from positive terminal 11 into the various circuit paths including the first and second branches of the three branch network toward the substrate connection 12. The inductance of the transformer 17 develops a negative going voltage in respect to current flowing out the tap 18 on the transformer, absorbing energy into the magnetic field and reducing the voltage at the terminal 13 and causing a greater proportion of the current from the first current sink Q3 to flow through the diode D2 in the first branch than into the second branch. The differential voltage established, favors the growth of current in the first branch over that in the second branch and by virtue of the cascading, favors an increase in current through Q2 which produces a further inductive decrease in the potential at terminal 13 and a further decrease in current in the second branch. The process continues until the current reaches the upper limit, setting the maximum energy storage in the magnetic field. As the magnetic field collapses, the energy is transferred to charge the capacitor 15 in the reverse sense. A negative voltage peak across the capacitor is reached when all the energy is transferred to the capacitor. After the negative voltage peak, the capacitor discharges through the inductor in an inverse sense, reversing the prior sense of the differential voltage between the first and second branch. The first branch is now turned off and the second branch is now turned on, and the trend continues to a point where the second branch conducts all of the current available from the sink Q3 and the first branch is nonconducting.

The negative conductance available from the active elements of the circuit may be calculated as follows, where M3=M1+M2:

$$-G = \frac{R2}{R1+R2}\,\frac{M3}{R3} - \frac{1}{R1+R2} \qquad (1)$$

$$= \frac{1}{2}\,\frac{3.05}{262} - \frac{1}{500}$$

$$G = \sim -.004$$

The "positive" load conductance reflected from the erase head should be less than the negative conductance value. This insures oscillation and a close to 50% duty cycle in a trapezoidal output waveform varying between the indicated current limits. The voltage swing is controlled by an appropriate choice of transformer turns ratio. The fundamental current amplitude is 2 I peak/π. Defining the peak voltage swing (V peak) in terms of the largest current expected, e.g. 23 ma, the resonant impedance ($R_L$) should be:

$$R_L = \frac{\pi \text{ V peak}}{2\, I \text{ peak}} \qquad (2)$$

Where V peak should be selected sufficiently low to prevent saturation of transistor Q2. In a practical case, the design may provide a plus and minus 3-volt swing or a 6 volt peak-to-peak output with a 4 volt dc supply.

The oscillator so far described is designed to operate with a conventional erase head of the type which requires typically 25 ma rms at 50 KHz. The peak head voltage may be obtained from the head drive requirement, and the reactance of the head. Given that the IC should operate with a given dc bias over a given range, for example 3 volts for a 4 volt dc bias, the autotransformer turns ratio may be calculated. Using the transformer/head parameters one then obtains the required secondary current (Is) drive:

$$Is \sim QI_H$$

where $I_H$ is head drive current. The primary rms current drive (=NIs) thus sets the peak-to-peak current output requirement of the integrated circuit.

Adjustment of the turns ratio of the autotransformer 16 permits a range of adjustment of a given integrated circuit to the requirements of a variety of erase heads. The transformer design is conventionally one in which the winding is provided using a flanged "bobbin" and a surrounding cup core configuration. The configuration provides a significant air gap preventing saturation and uses a ferrite magnetic material suitable for 450 KHz operation.

The foregoing oscillator design is optimized for use in an integrated circuit in association with other circuitry performing other functions in connection with a tape recorder. In this application, it is desirable that each included circuit function require a minimum of additional terminal pins. In the present oscillator, the connections 11 and 12 are common to those already required by other portions of the integrated circuit. Only the single terminal pin 13 need be added to allow inclusion of the oscillator function.

While the foregoing circuit illustrated conventional integrated circuit current source and current sink configurations in which the base bias paths include both a diode and a resistance in shunt with the serial combination of the input junction of the active transistor and its emitter resistance, in certain cases the values of these resistances may be changed and in some cases the resistances eliminated altogether without impairing the current setting function of the network.

Throughout the description, the term "current source" or "current sink" has been used in the sense of a class of a constant current stage, as the term is used in the book entitled "Analog Integration Circuit Design" by Grebene, Van Nostrand Reinholdt Company, 1972, Chapter 4, Section 4.1, "in a constant current stage, the reference current in one branch of the circuit is accurately reproduced in a second branch, relatively independent of the absolute values of device parameters." This implies that the impedance of the "load" in the second branch is small in relation to the "source" impedance, and that the constant current stage be regarded as simulating a current generator with one terminal connected to an ac ground.

While the maximum and minimum current levels are established by the first current sink ($I_{CC}$), in the event that another pin is available for the oscillator function, one may provide a resistance R7 external to the integrated circuit. The base of Q3 should then be biased one diode drop above the output voltage of a band gap regulator. This will permit a selection of the resistance R7 and a setting of the current ($I_{CC}$) with a greater precision than is provided by the "on chip" processed resistance (R7).

In addition, while specific circuit values have been shown which produce a current proportionality (M1) of one for the current source (Q1), and a current proportionality (M2) of 10 for the second current sink (Q2), these values are optimized for the intended application and may be altered as the application demands. A unity current proportionality (M1) has the advantage of insuring a practical M1 tolerance with expected IC process variations. Unity M1 implies insensitivity to PNP $\beta$ variation, for the low $\beta$ values encountered at higher current levels (1.7 mA is high for a lateral PNP even with a 4× device). An M2 value of 10, for similar reawithdraw a controlled current ($I_{CC}$) from said node, any decreases in current in said second branch increasing the current in said first branch and vice versa; and (3) the collector thereof connected through a load including a third diode to said second terminal, the source current occurring in said collector having a first proportionality (M1) to said controlled current ($I_{CC}$) when said diode in said second branch is nonconductive, and C. a second current sink comprising a second transistor gain element having (1) the emitter thereof conductively connected to said second terminal, (2) the collector thereof connected in a sense to withdraw from said third terminal a current which has a second proportionality (M2) to said source current [(M1) ($I_{CC}$)] substantially greater than one, when the diode in said second branch is nonconductive, the circuit having a first state in which said first branch is conductive and said second branch is nonconductive, and a second state in which said second branch is conductive and said first branch is nonconductive.

9. A negative resistance circuit as set forth in claim 8 wherein a first resistance (R3) is provided for conductively connecting the emitter of said first transistor to said first terminal, a second resistance (R2) is provided in said first branch in series with said first diode, and a third resistance is provided in said second branch in series with said second diode, the circuit parameters establishing the following inequality $$R_2/R_3\,(M1)\,(M2) > 1.$$

* * * * *

UNITED STATES PATENT AND TRADEMARK OFFICE
CERTIFICATE OF CORRECTION

PATENT NO. : 4,378,531

DATED : March 29, 1983

INVENTOR(S) : Glenn B. Gawler

It is certified that error appears in the above-identified patent and that said Letters Patent is hereby corrected as shown below:

The Title page and the Drawing Figure should be deleted to appear as per the attached sheets.

Column 2, line 16, "first" should be --second--.
line 17, "a decrease" should be --an increase--.
"second" should be --first--.

Signed and Sealed this

*Fourth* Day of *September 1984*

[SEAL]

*Attest:*

GERALD J. MOSSINGHOFF

*Attesting Officer* *Commissioner of Patents and Trademarks*

United States Patent [19] [11] 4,378,531
Gawler [45] Mar. 29, 1983

[54] NEGATIVE RESISTANCE OSCILLATOR SUITED FOR PARTIAL INTEGRATION

[75] Inventor: Glenn B. Gawler, Liverpool, N.Y.
[73] Assignee: General Electric Company, Syracuse, N.Y.

[21] Appl. No.: 242,368
[22] Filed: Mar. 10, 1981
[51] Int. Cl.[3] ............ H03B 7/06
[52] U.S. Cl. ............ 331/115; 331/117 R
[58] Field of Search ............ 331/117 R, 108 C, 108 D, 331/115, 132, 133, 134, 151, 167, 150

[56] References Cited

U.S. PATENT DOCUMENTS 3,986,152 10/1976 Howell ............ 331/115 X
4,230,999 10/1980 Ahmed ............ 331/115

OTHER PUBLICATIONS

Greben, A. B., "Monolithic Waveform Generation", *IEEE Spectrum*, pp. 34-40, Apr. 1972, (reprinted in Analog Integrated Circuit Design, pp. 378-384, A. B. Grebene, 1972).

*Primary Examiner*—Siegfried H. Grimm
*Assistant Examiner*—Tim A. Wiens
*Attorney, Agent, or Firm*—Richard V. Lang

[57] ABSTRACT

A novel negative resistance oscillator is disclosed for partial integration. The oscillator has a tank circuit and a load, which are non-integrated, and active circuitry, which is integrated. The active circuit consists of a current "source" and two current "sinks", arranged to provide a negative resistance. The oscillator, which is designed to drive an erase head in a tape recorder, as a part of a tape recorder integrated circuit, requires only a single additional pin, has a controlled peak current range, a large dc voltage swing for a given dc supply potential, and an efficient dc to ac current conversion ratio.

9 Claims, 1 Drawing Figure

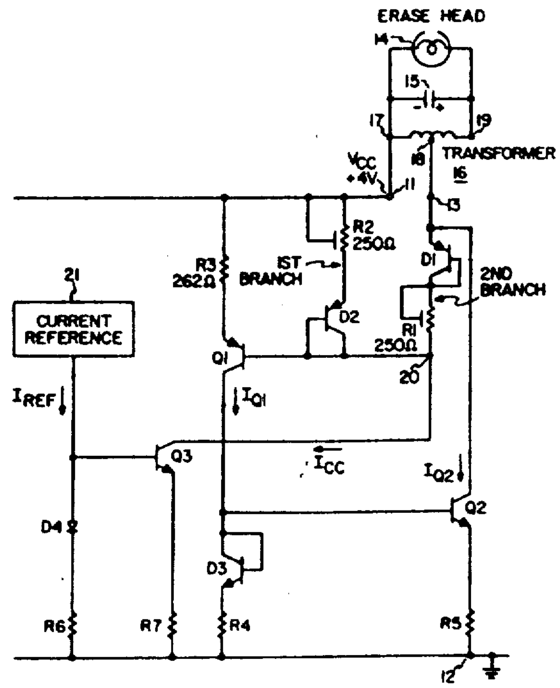

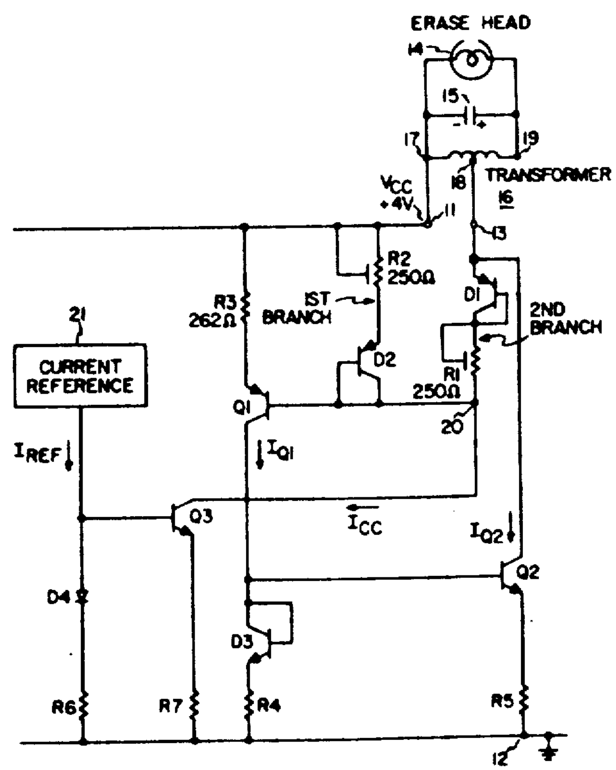
ERASE HEAD
14
15
17
19
18
TRANSFORMER
16
VCC
+4V
11
13
R2
250Ω
R3
262Ω
1ST
BRANCH
D1
2ND
BRANCH
21
CURRENT
REFERENCE
D2
R1
250Ω
Q1
20
IREF
IQ1
Q3
ICC
IQ2
Q2
D4
D3
R6
R7
R4
R5
12